United States Patent
Carroll

(10) Patent No.: US 8,422,699 B2
(45) Date of Patent: Apr. 16, 2013

(54) LOUDNESS CONSISTENCY AT PROGRAM BOUNDARIES

(75) Inventor: Timothy J. Carroll, Lancaster, PA (US)

(73) Assignee: Linear Acoustic, Inc., Lancaster, PA (US)

( * ) Notice: Subject to any disclaimer, the term of this patent is extended or adjusted under 35 U.S.C. 154(b) by 309 days.

(21) Appl. No.: 12/763,177

(22) Filed: Apr. 19, 2010

(65) Prior Publication Data

US 2010/0272290 A1    Oct. 28, 2010

Related U.S. Application Data

(60) Provisional application No. 61/170,420, filed on Apr. 17, 2009.

(51) Int. Cl.
H03G 3/00 (2006.01)
H04R 29/00 (2006.01)

(52) U.S. Cl.
USPC ............................................. 381/104; 381/58

(58) Field of Classification Search ............ 381/94.8, 381/94.4, 107, 317, 106, 73.1, 58, 104; 455/222, 455/223
See application file for complete search history.

(56) References Cited

U.S. PATENT DOCUMENTS

| | | | |
|---|---|---|---|
| 4,887,299 A * | 12/1989 | Cummins et al. | 381/317 |
| 6,795,559 B1 * | 9/2004 | Taura et al. | 381/94.8 |
| 7,398,207 B2 | 7/2008 | Riedl | |
| 7,496,418 B2 | 2/2009 | Kim et al. | |
| 8,275,153 B2 * | 9/2012 | Wei | 381/107 |
| 2005/0123152 A1 * | 6/2005 | Magrath | 381/104 |
| 2008/0013745 A1 | 1/2008 | Chen | |
| 2008/0095385 A1 | 4/2008 | Tourwe | |
| 2008/0221895 A1 | 9/2008 | Pauws et al. | |
| 2008/0253586 A1 | 10/2008 | Wei | |
| 2009/0046873 A1 | 2/2009 | Riedl | |
| 2009/0097676 A1 * | 4/2009 | Seefeldt | 381/107 |
| 2012/0155659 A1 * | 6/2012 | Crockett et al. | 381/57 |

OTHER PUBLICATIONS

Pauws, Steffen, "Musical Key Extraction from Audio", Philips Research Laboratories Eindhoven, the Netherlands, 2004.
"DTV and 'The Annoyingly Loud Commercial Problem'", TV Technology, obtained online at http://tvtechnology.com/article/printableView.aspx?contentid=12644, pp. 1-3.

* cited by examiner

*Primary Examiner* — Fan Tsang
*Assistant Examiner* — Eugene Zhao
(74) *Attorney, Agent, or Firm* — Renner, Otto, Boisselle & Sklar, LLP

(57) ABSTRACT

Improving loudness consistency of an audio stream may include delaying an encoded audio stream and adjusting the delayed encoded audio stream based at least in part on the loudness of the audio stream before a transition and the loudness of the audio stream after the transition. Improving loudness consistency of an audio stream may further include determining the loudness of the audio stream before the transition, detecting the transition, storing the loudness of the audio stream before the transition, and determining the loudness of the audio stream after the transition.

22 Claims, 5 Drawing Sheets

LOUDNESS CONSISTENCY AT PROGRAM BOUNDARIES

CROSS REFERENCE TO RELATED APPLICATIONS

This application claims the benefit of U.S. Provisional Application No. 61/170,420 filed Apr. 17, 2009, which is incorporated here by reference.

BACKGROUND

Programming such as television programs is, in many cases, produced with variable loudness and wide dynamic range to convey emotion or a level of excitement in a given scene. For example, a movie may include a scene with the subtle chirping of a cricket and another scene with the blasting sound of a shooting cannon. Interstitial material such as commercial advertisements, on the other hand, is very often intended to convey a coherent message, and is, thus, often produced at a constant loudness, narrow dynamic range, or both.

Conventionally, annoying disturbances occurred at the point of transition between the programming and the interstitial material. This is commonly known as the "loud commercial problem." In some cases, even when switching between programming and interstitial material that had matched average loudness and dynamic range, the loudness of the programming may decrease for artistic reasons for a period of time, possibly enough time to cause users to increase the volume of the audio. When this quieter-than-average section of the program switched to interstitial material that matched the original average loudness of the programming, the interstitial material may be too loud due to the increase in volume by the user.

Conventionally, processes addressing the loud commercial problem modified the audio itself, thus making the processes irreversible. However, not all viewers may desire to have the programming audio changed in such a way.

Conventionally, techniques have focused on managing average loudness of one segment versus another segment, ignoring short term changes at boundary points. Other conventional techniques essentially change all of the audio at all times, differing little from a standard dynamic range controller that may be found in analog broadcast.

SUMMARY

Improving loudness consistency of an audio stream may include delaying an encoded audio stream and adjusting the delayed encoded audio stream based at least in part on the loudness of the audio stream before a transition and the loudness of the audio stream after the transition. Improving loudness consistency of an audio stream may further include determining the loudness of the audio stream before the transition, detecting the transition, storing the loudness of the audio stream before the transition, and determining the loudness of the audio stream after the transition.

BRIEF DESCRIPTION OF THE DRAWINGS

The accompanying drawings, which are incorporated in and constitute a part of the specification, illustrate various example systems, methods, and so on, that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Figure 1:
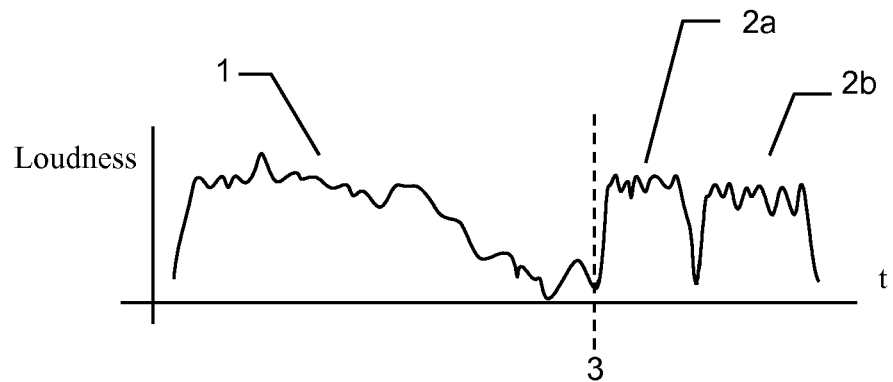
FIG. 1 illustrates a graph depicting short term loudness of a program with interstitial material inserted.

The following includes definitions of selected terms employed herein. The definitions include various examples and/or forms of components that fall within the scope of a term and that may be used for implementation. The examples are not intended to be limiting. Both singular and plural forms of terms may be within the definitions.

"Programming" and "program," as used herein, refer to content that consumers commonly set out to watch, including, but not limited to, television programs, shows, movies, documentaries, news, game shows, situation comedies, and so on.

"Interstitial material," as used herein, refers to material other that programming or programs which consumers would not commonly set out to watch, but that commonly provides revenue for the organization broadcasting the programming. Interstitial material is commonly produced and paid for by an organization that seeks to convey a message. Non limiting examples of interstitial material are television commercials, political commercials, and so on.

"Boundary," as used herein in relation to programming and interstitial material, refers to a portion of the program or interstitial material just before or just after a transition point from program to interstitial material, from interstitial material to program, from one program to a second program, from one interstitial material to another interstitial material, and so on.

"Data store," as used herein, refers to a physical and/or logical entity that can store data. A data store may be, for example, a database, a table, a file, a list, a queue, a heap, a memory, a register, and so on. A data store may reside in one logical and/or physical entity and/or may be distributed between two or more logical and/or physical entities.

"Logic," as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like an application specific integrated circuit (ASIC), a programmed logic device, a memory device containing instructions, or the like. Logic may include one or more gates, combinations of gates, or other circuit components. Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

An "operable connection," or a connection by which entities are "operably connected," is one in which signals, physical communications, and/or logical communications may be sent and/or received. Typically, an operable connection includes a physical interface, an electrical interface, and/or a data interface, but it is to be noted that an operable connection may include differing combinations of these or other types of connections sufficient to allow operable control. For example, two entities can be operably connected by being able to communicate signals to each other directly or through one or more intermediate entities like a processor, operating system, a logic, software, or other entity. Logical and/or physical communication channels can be used to create an operable connection.

"Signal," as used herein, includes but is not limited to one or more electrical or optical signals, analog or digital signals, data, one or more computer or processor instructions, messages, a bit or bit stream, or other means that can be received, transmitted and/or detected.

"Software," as used herein, includes but is not limited to, one or more computer or processor instructions that can be read, interpreted, compiled, and/or executed and that cause a computer, processor, or other electronic device to perform functions, actions and/or behave in a desired manner. The instructions may be embodied in various forms like routines, algorithms, modules, methods, threads, and/or programs including separate applications or code from dynamically and/or statically linked libraries. Software may also be implemented in a variety of executable and/or loadable forms including, but not limited to, a stand-alone program, a function call (local and/or remote), a servelet, an applet, instructions stored in a memory, part of an operating system or other types of executable instructions. It will be appreciated by one of ordinary skill in the art that the form of software may depend, for example, on requirements of a desired application, the environment in which it runs, and/or the desires of a designer/programmer or the like. It will also be appreciated that computer-readable and/or executable instructions can be located in one logic and/or distributed between two or more communicating, co-operating, and/or parallel processing logics and thus can be loaded and/or executed in serial, parallel, massively parallel and other manners.

Suitable software for implementing the various components of the example systems and methods described herein may be produced using programming languages and tools like Java, Pascal, C#, C++, C, CGI, Perl, SQL, APIs, SDKs, assembly, firmware, microcode, and/or other languages and tools. Software, whether an entire system or a component of a system, may be embodied as an article of manufacture and maintained or provided as part of a computer-readable medium as defined previously. Another form of the software may include signals that transmit program code of the software to a recipient over a network or other communication medium. Thus, in one example, a computer-readable medium has a form of signals that represent the software/firmware as it is downloaded from a web server to a user. In another example, the computer-readable medium has a form of the software/firmware as it is maintained on the web server. Other forms may also be used.

"User," as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are the means used by those skilled in the art to convey the substance of their work to others. An algorithm is here, and generally, conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic and the like.

It has proven convenient at times, principally for reasons of common usage, to refer to these signals as bits, values, elements, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, computing, calculating, determining, displaying, or the like, refer to actions and processes of a computer system, logic, processor, or similar electronic device that manipulates and transforms data represented as physical (electronic) quantities.

FIG. 1 illustrates a graph depicting the short term loudness of a program 1 with interstitial material 2a and 2b inserted. While the average loudness of program 1 and interstitial material 2a and 2b may be similar, loudness immediately preceding the transition 3 between program 1 and interstitial material 2a is lower than the average loudness of program 1 and interstitial material 2a. For example, the loudness of program 1 immediately preceding transition 3 may have been lowered for artistic effect. Because of the lower loudness immediately preceding transition 3, a user listening to audio of program 1 may decide to increase the volume of the audio.

Figure 2:
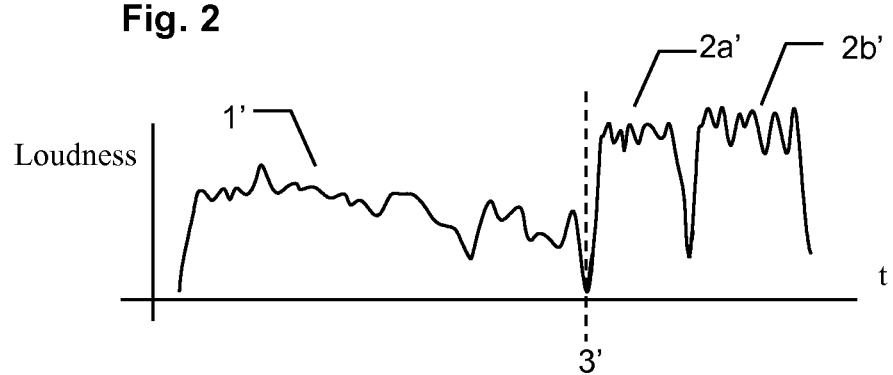
FIG. 2 illustrates a graph depicting short term loudness of a program with interstitial material inserted.

FIG. 2 illustrates a graph depicting the short term loudness of the same material depicted in FIG. 1, except that in FIG. 2 a user has made a volume control adjustment to increase the short term loudness of the program, now program 1', immediately preceding the transition, now transition 3'. While the adjustment made by the user may bring the loudness of program 1' immediately preceding transition 3' closer to the average loudness of program 1', the short term loudness of the audio of interstitial material 2a' and 2b' after transition 3' may now be higher than the average loudness of program 1'. The user must once again adjust the volume to reach a more acceptable loudness, this time to lower the loudness.

Figure 3:
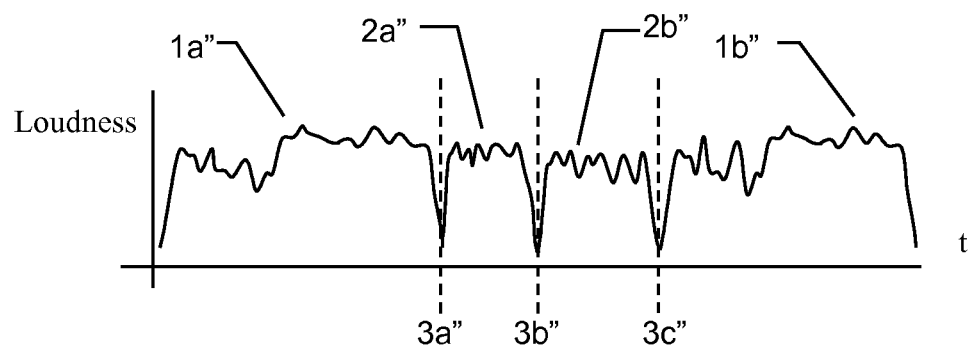
FIG. 3 illustrates a graph depicting short term loudness of a program with interstitial material inserted.

FIG. 3 illustrates a graph depicting the short term average loudness of program sections 1a'' and 1b'' and interstitial material sections 2a'' and 2b''. The loudness of the program and intestinal material sections may be matched at the points of transition 3a'', 3b'', and 3c''. The results of the loudness matching include improved loudness consistency at the program boundaries and loudness that is more acceptable to the user.

Figure 4:
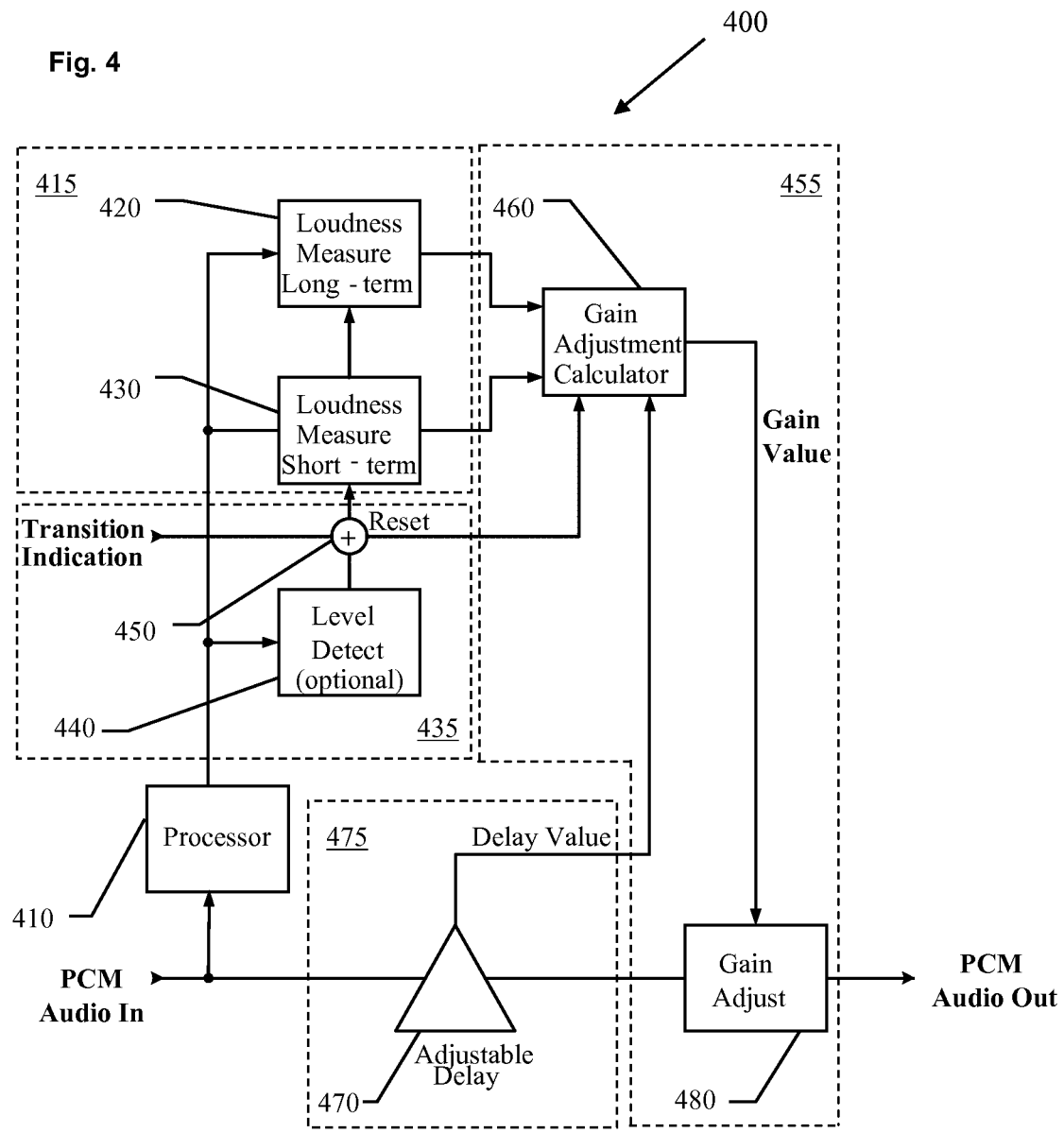
FIG. 4 illustrates a block diagram of an example system for improving loudness consistency at program boundaries.

FIG. 4 illustrates a block diagram of an example system 400 for improving loudness consistency at program boundaries. System 400 may delay the audio input, PCM Audio In, and determine the amount of loudness adjustment necessary at boundaries before and after a transition point between program and interstitial material. Because the audio has been delayed, system 400 may apply the determined adjustments gradually to move the loudness of the material on each side of the transition closer to a median loudness. Both sides of the transition between program and interstitial material may be adjusted in level and loudness to come closer to a mean value and improve the loudness consistency of the transition. The resulting audio output, PCM Audio Out, may then have a relatively smooth loudness transition between program and interstitial material.

In the example embodiment, pulse code modulated audio, PCM Audio In, may be received by a processor 410. The processor 410 can be of a variety of processors including discrete processors, dual microprocessor, and other multi-processor and integrated circuit architectures. PCM Audio In may contain both program and interstitial material. Processor 410 may select one or more channels for measurement of PCM Audio In.

System 400 may further include a loudness measuring logic 415. In one embodiment, loudness measuring logic 415 includes Loudness Measure Long-Term 420 and Loudness Measure Short-Term 430. In the embodiment, Loudness Measure Long-Term 420 measures the long term weighted loudness of PCM Audio In, while Loudness Measure Short-Term 430 measures the short term weighted loudness of PCM Audio In. Loudness Measure Long-Term 420 and Loudness Measure Short-Term 430 may employ one or more loudness measurement algorithms or methods (e.g. Leq(A), ITU-R BS.1770, CBS Loudness, and so on).

System 400 may receive a Transition Indication signal via a transition indication logic 435. In one embodiment, the Transition Indication signal may be an externally supplied trigger (e.g. contact closure, serial control, Ethernet TCP/IP control, metadata control via serial connection, metadata extracted from vertical ancillary data space ("VANC") of digital video as described in SMPTE RP 2020, and so on).

In one embodiment, system 400 and transition indication logic 435 may include a level detect 440 to provide the Transition Indication signal. Level detect 440 may determine a point of transition at a boundary by detecting loudness or level of audio in PCM Audio In falling below or rising above some threshold. In one embodiment (not shown), level detect 440 may receive video or picture information. In the embodiment, level detect 440 may indicate a point of transition at a boundary by detecting the video or picture information falling below or rising above some threshold.

The Transition Indication signal may be received by or-ing function 450. Or-ing function 450, in turn, may send a Reset signal based on the Transition Indication signal to Loudness Measure Long-Term 420 and/or Loudness Measure Short-Term 430. Upon receiving the Reset signal, the current loudness measurements values of one or both of Loudness Measure Long-Term 420 and Loudness Measure Short-Term 430 may be stored, and one or both of Loudness Measure Long-Term 420 and Loudness Measure Short-Term 430 may be reset. The stored measurements represent the short and long-term loudness of the outgoing audio prior to the transition, while the active measurements represent the incoming audio starting immediately after the transition.

The outputs of Loudness Measure Long-Term 420, Loudness Measure Short-Term 430, and or-ing function 450 (the point of transition) may be applied to a gain adjustment logic 455 including Gain Adjustment Calculator 460. Also applied to Gain Adjustment Calculator 460 is a Delay Value signal from Adjustable Delay 470.

Delay Logic 475 includes Adjustable Delay 470 which is configured to delay PCM Audio In by an amount of time. Adjustable Delay 470 outputs the delayed audio and the Delay Value signal which indicates the amount of time by which the audio has been delayed. The delay may be any value that produces acceptable results. In one embodiment, the amount of delay time may be programmable or adjustable. In one embodiment, the delay may be adjusted such that the delay allows enough time for adjustment of the audio stream to complete without producing audible artifacts in the audio. In one embodiment, the delay may be part of a profanity or content protection delay.

From the received information, Gain Adjustment Calculator 460 may output a Gain Value signal.

Gain adjustment logic 455 may further include Gain Adjustment 480 which receives the Gain Value signal and applies it to the delayed audio from Adjustable Delay 470. The resulting PCM Audio Out may then have a relatively smooth loudness transition between program and interstitial material.

Figure 5:
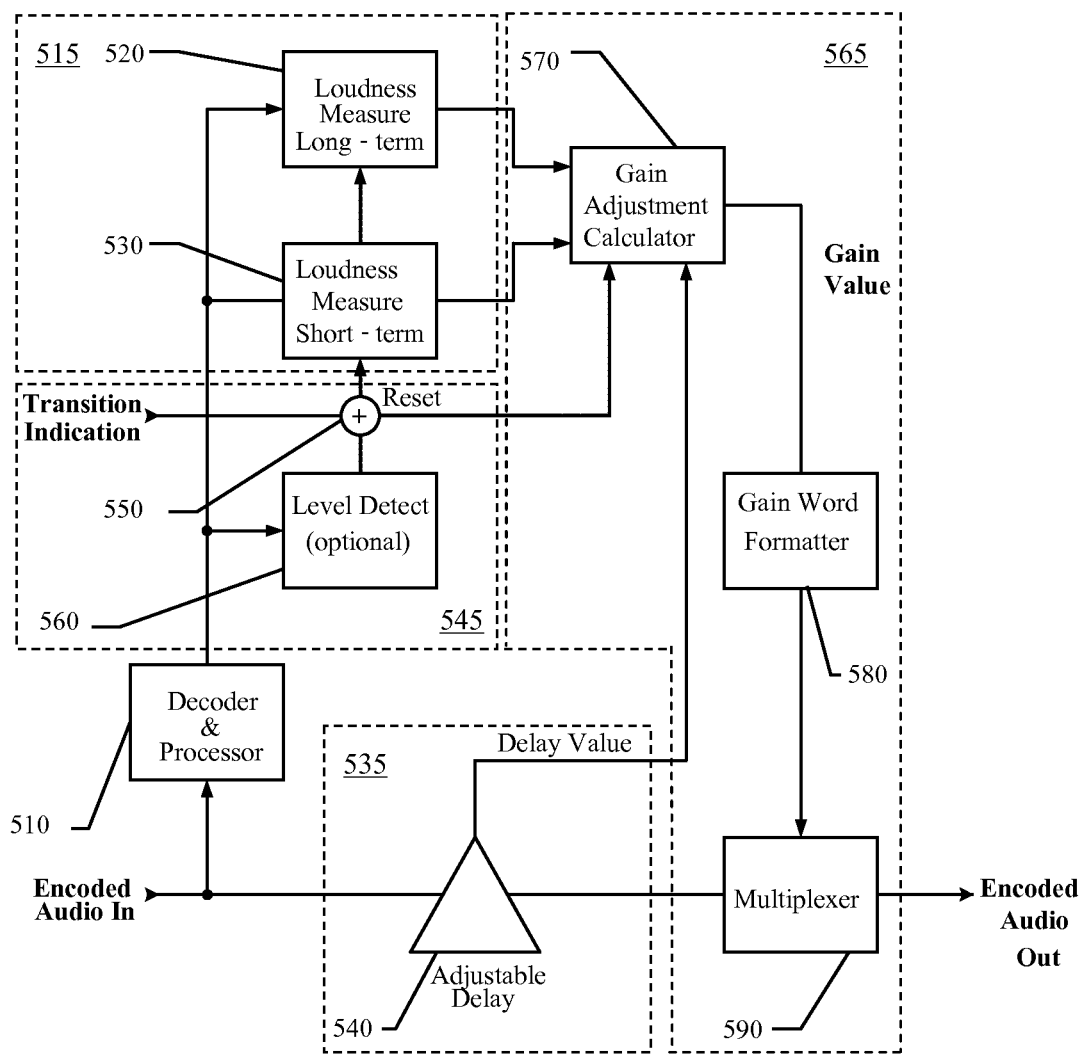
FIG. 5 illustrates a block diagram of an example system for improving loudness consistency at program boundaries.

Referring now to FIG. 5, modern distribution of audio signals to consumers may involve the use of audio data rate reduction or audio compression techniques to lower the amount of data required to deliver the audio signals to consumers, while causing minimal impact to the original audio quality. Coding systems including AC-3, DTS, MPEG-2 AAC, HE AAC, and so on, are examples of audio data rate reduction techniques.

Coding systems may encode audio metadata, also known as data about the audio data, to describe the encoded audio. This audio metadata may be multiplexed in with the compressed audio data and delivered to user's premises, where it may be extracted and applied to the audio in a user-adjustable manner.

Dialogue normalization ("dialnorm") and dynamic range compression ("DRC") are example AC-3 parameters that may be encoded as audio metadata. Dialnorm is intended to control average loudness. DRC is intended to control program dynamic range. For these parameters to perform their intended functions, the parameters must be correctly measured and set. Although the AC-3 system is used as an example for purposes of discussion, the subject matter of this application may be applicable to any coding system, audio or video.

FIG. 5 illustrates a block diagram of an example system 500 for improving loudness consistency at program boundaries. Example system 500 may operate in the encoded domain to delay the audio input Encoded Audio In and determine the amount of loudness adjustment necessary on each side of a transition point between program and interstitial material. Because the audio has been delayed, system 500 may apply the determined adjustments gradually to move each side of the transition closer to a median loudness. The resulting audio output Encoded Audio Out may then have a relatively smooth loudness transition between program and interstitial material.

In the example embodiment, an encoded audio signal Encoded Audio In may be applied first to Decoder and Processor 510. The output of Decoder and Processor 510 may be sent to a loudness measuring logic 515. Loudness measuring logic 515 includes Loudness Measure Long-Term 520 and Loudness Measure Short-Term 530. Loudness Measure Long-Term 520 and Loudness Measure Short-Term 530 may employ one or more loudness measurement methods or algorithms (e.g. Leq(A), ITU-R BS.1770, CBS Loudness, and so on).

Encoded Audio In may also be applied to a delay logic 535 which includes Adjustable Delay 540. Adjustable Delay 540 delays Encoded Audio In by an amount of time, and outputs the delayed audio signal and the Delay Value signal which indicates the amount of time by which the audio signal has been delayed. The delay may be any value that produces acceptable results. In one embodiment, the amount of delay time may be adjustable. In one embodiment, the delay may be adjusted such that the delay allows enough time for adjustment of the audio stream to complete without producing audible artifacts in the audio. In one embodiment, the delay may be part of a profanity or content protection delay.

System 500 may further include a transition indication logic 545. Transition indication logic 545 may include an or-ing function 550. Or-ing function 550 may accept a Transition Indication signal. In one embodiment, the Transition Indication signal may be an externally supplied trigger (e.g. contact closure, serial control, Ethernet TCP/IP control, metadata control via serial connection, metadata extracted from VANC space of digital video as described in SMPTE RP 2020, and so on).

In one embodiment, transition indication logic 545 may optionally include a level detect 560 to provide the Transition Indication signal. Level detect 560 may indicate a point of transition between a program and interstitial material by detecting loudness or level of audio in the decoded audio falling below or rising above some threshold. In one embodiment (not shown), level detect 560 may receive video or picture information. Level detect 560 may indicate a point of transition between a program and interstitial material by detecting the video or picture information falling below or rising above some threshold. In other embodiments (not shown), level detect 560 may receive other data containing information that may be indicative of a transition point in the audio and indicate the point of transition between program and interstitial material by detecting the transition point.

Or-ing function 550, may send a Reset signal based on the Transition Indication signal to Loudness Measure Long-Term 520 and Loudness Measure Short-Term 530. Upon receiving the Reset signal, the current loudness measurements values of one or both of Loudness Measure Long-Term 520 and Loudness Measure Short-Term 530 may be stored, and one or both of Loudness Measure Long-Term 520 and Loudness Measure Short-Term 530 may be reset. The stored measurements represent the short and long-term loudness of the audio prior to the point of transition, while the active or current measurements after reset represent the incoming audio starting immediately after the transition.

The system 500 may further include a gain adjustment logic 565 including a Gain Adjustment Calculator 570, a Gain Word Formatter 580 and a Multiplexer 590.

The outputs of Loudness Measure Long-Term 520 and Loudness Measure Short-Term 530, the Transition Indication signal, and the Delay Value signal from Adjustable Delay 540 may be applied to the Gain Adjustment Calculator 570, which outputs a gain value. This gain value may be applied to the Gain Word Formatter 580, which produces a gain control metadata parameter. This gain control metadata parameter may be inserted in the delayed encoded audio output of Adjustable Delay 540 by the Multiplexer 590.

The resulting Encoded Audio Out may have a relatively smooth transition between program and interstitial material. Both sides of the transition between program and interstitial material may be adjusted in level and loudness to come closer to a mean value and improve the loudness consistency of the transition. Implementation of system 500 in the encoded domain may allow for the changes to Encoded Audio In resulting in Encoded Audio Out to be reversed by a user after decoding of Encoded Audio Out, thereby restoring the original audio.

In some embodiments, example system 500 may work alone or in tandem with additional audio processing equipment to control dynamic range, and may operate in the baseband PCM or compressed domains (e.g. AC-3, DTS, MPEG, and so on) via standard gain adjustments or metadata manipulation. When switching between programming and interstitial material that have appropriately matched average loudness and dynamic range, and properly indicated metadata, a smooth transition between the programming and the interstitial material may result.

Figure 6:
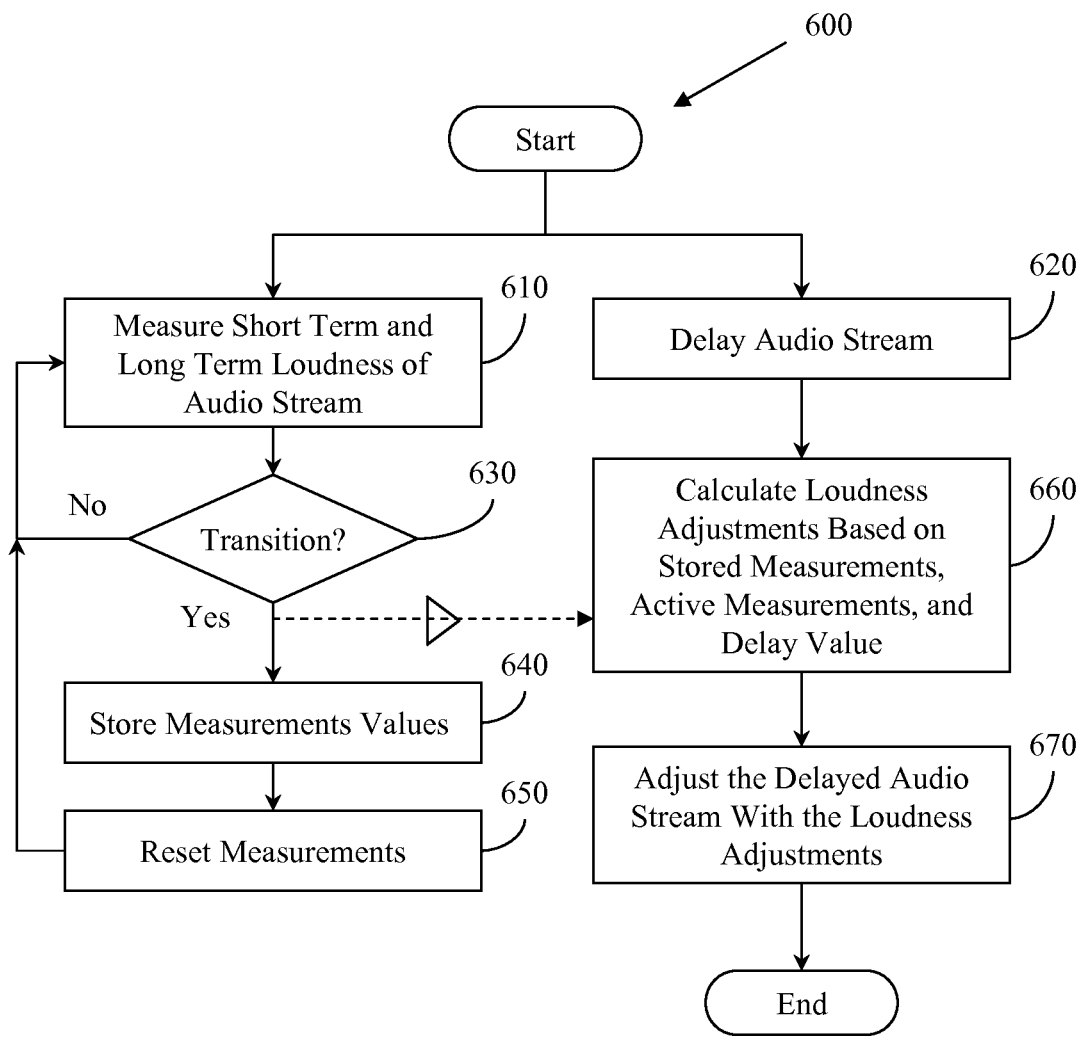
FIG. 6 illustrates a flow diagram for an example method for improving loudness consistency at program boundaries.
Figure 7:
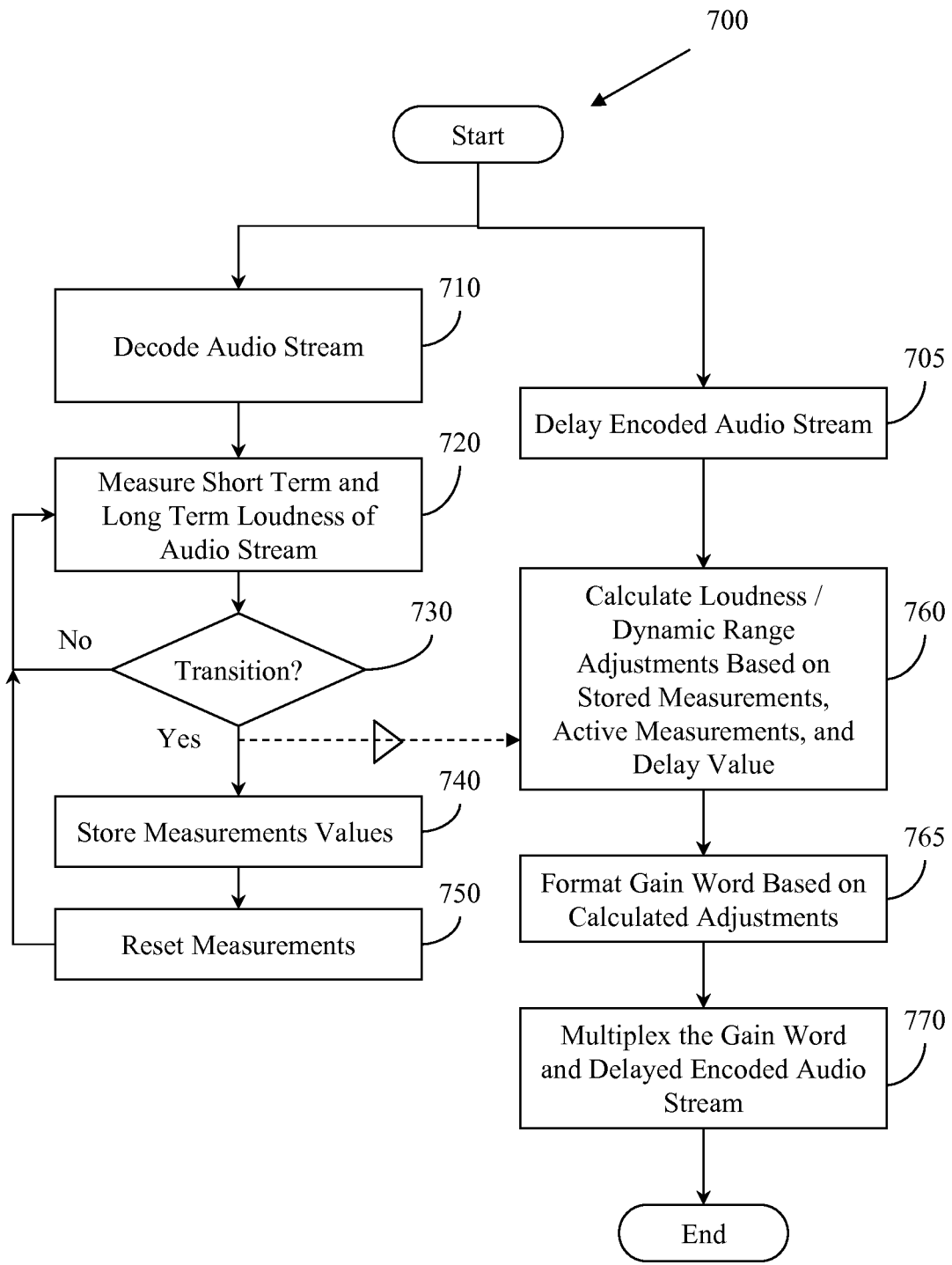
FIG. 7 illustrates a flow diagram for an example method for improving loudness consistency at program boundaries.

Example methods may be better appreciated with reference to the flow diagrams of FIGS. 6 and 7. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Furthermore, additional methodologies, alternative methodologies, or both can employ additional, not illustrated blocks.

In the flow diagrams, blocks denote "processing blocks" that may be implemented with logic. The processing blocks may represent a method step and/or an apparatus element for performing the method step. The flow diagrams do not depict syntax for any particular programming language, methodology, or style (e.g., procedural, object-oriented). Rather, the flow diagrams illustrate functional information one skilled in the art may employ to develop logic to perform the illustrated processing. It will be appreciated that in some examples, program elements like temporary variables, routine loops, and so on, are not shown. It will be further appreciated that electronic and software applications may involve dynamic and flexible processes so that the illustrated blocks can be performed in other sequences that are different from those shown and/or that blocks may be combined or separated into multiple components. It will be appreciated that the processes may be implemented using various programming approaches like machine language, procedural, object oriented and/or artificial intelligence techniques.

FIG. 6 illustrates a flow diagram for an example method 600 for improving loudness consistency at program boundaries. At 610, method 600 may measure the short term and/or long term loudness of an audio stream containing both program and interstitial material. At 620, the audio stream may be delayed by some amount of time. At 630, when an indication of the point of transition is received by one or multiple means, the current values of the short term and long term loudness of the audio stream are stored at 640. At 650, one or both of the short and long term measurements may be reset. After reset, method 600 may go back to 610 to actively measure the short term and long term loudness of the audio stream after the point of transition. The stored measurements represent the short and long-term loudness of the outgoing audio prior to the transition, while the active measurements represent the incoming audio starting immediately after the transition. Based on the stored measurements, the active measurements, and the delay value, at 660, method 600 may calculate a loudness adjustment. At 670, method 600 may adjust the delayed audio with the loudness adjustment.

FIG. 7 illustrates a flow diagram for an example method 700 for improving loudness consistency at program boundaries for an audio stream containing both program and interstitial material. At 705, the audio stream may be delayed by some amount of time. At 710, method 700 may decode the audio stream. At 720, method 700 may measure the short term and/or long term loudness of the audio stream. At 730, when an indication of the point of transition is received by one or multiple means, the current values of the short term and long term loudness of the audio stream are stored at 740. At 750, one or both of the short and long term measurements may be reset. After reset, method 700 may go back to 720 to actively measure the short term and long term loudness of the audio stream after the point of transition. The stored measurements represent the short and long-term loudness of the outgoing audio prior to the transition, while the active measurements represent the incoming audio starting immediately after the transition. Based on the stored measurements, the active measurements, and the delay value, at 760, method 700 may calculate an adjustment of loudness, dynamic range, or both. At 765, method 700 may format a metadata gain word based on the calculated adjustments. At 770, method 700 may multiplex the gain word and delayed audio stream.

The delay value being adjustable, example methods 600 and 700 may make measurements and adjustments over an adjustable portion on each side of the point of transition. Unlike prior art techniques that may require very lengthy measurement times in order to correct entire segments of audio to some average loudness, example methods 600 and 700 may make adjustments at the part of the audio around the point of transition.

While FIGS. 6 and 7 illustrate various actions occurring in serial, it is to be appreciated that various actions illustrated could occur substantially in parallel, and while actions may be shown occurring in parallel, it is to be appreciated that these actions could occur substantially in series. While a number of processes are described in relation to example methods 600 and 700, it is to be appreciated that a greater and/or lesser number of processes could be employed and that lightweight processes, regular processes, threads, and other approaches could be employed. It is to be appreciated that other example methods may, in some cases, also include actions that occur substantially in parallel. Example methods 600 and 700 and other embodiments may operate in real-time, faster than real-time in a software or hardware or hybrid software/hardware implementation, or slower than real time in a software or hardware or hybrid software/hardware implementation.

While example systems, methods, and so on, have been illustrated by describing examples, and while the examples have been described in considerable detail, it is not the intention of the applicants to restrict or in any way limit scope to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A method for improving loudness consistency of an audio stream, the method comprising:
    delaying an encoded audio stream by a delay time;
    determining loudness values of the audio stream before a transition;
    detecting the transition;
    storing the loudness values of the audio stream before the transition;
    determining loudness values of the audio stream after the transition; and
    adjusting pre-transition and post-transition portions of the delayed encoded audio stream that are less than the entire delayed encoded audio stream based at least in part on the loudness values of the audio stream before the transition, the loudness values of the audio stream after the transition, and the delay time.

2. The method of claim 1, where the determining loudness values of the audio stream includes determining loudness values of short term loudness and long term loudness of the audio stream.

3. The method of claim 1, where the determining loudness values of the audio stream includes employing at least one of Leq(A), ITU-R BS.1770, and CBS Loudness.

4. The method of claim 1, where the transition corresponds to at least one selected from the group consisting of:
    from program to interstitial material,
    from interstitial material to program,
    from a first program to a second program, and
    from a first interstitial material to a second interstitial material.

5. The method of claim 1, where the detecting the transition includes at least one of:
    receiving a transition indication;
    detecting at least one of loudness and audio level of audio in the audio stream falling below or rising above a first threshold; and
    detecting at least one of video data and picture data falling below or rising above a second threshold.

6. The method of claim 1, further comprising:
    resetting the determined loudness values of the audio stream after storing the loudness values of the audio stream before the transition prior to determining loudness values of the audio stream after the transition.

7. The method of claim 1, where the adjusting the delayed encoded audio stream includes:
    calculating a loudness adjustment based at least in part on the loudness values of the audio stream before the transition, the loudness values of the audio stream after the transition, and the delay time; and
    adjusting the delayed encoded audio stream based at least in part on the loudness adjustment.

8. The method of claim 1, where the adjusting the delayed encoded audio stream includes:
    calculating a gain adjustment based at least in part on the loudness values of the audio stream before the transition, the loudness values of the audio stream after the transition, and the delay time;
    formatting a gain control metadata parameter; and
    inserting the gain control metadata parameter in the delayed encoded audio stream.

9. The method of claim 1, where the delay time is at least one of:
    a programmable delay time, and
    part of a profanity or content protection delay.

10. A system for improving loudness consistency, the system comprising:
    a processor configured to receive an encoded signal representing an audio stream;
    a delay logic configured to delay the encoded signal to produce a delayed encoded signal;

a transition indication logic configured to indicate a transition in the audio stream;

a loudness measuring logic configured to measure loudness of the audio stream before the transition and configured to measure loudness of the audio stream after the transition; and a gain adjustment logic configured to adjust gain of pre-transition and post-transition portions of the delayed encoded signal based at least in part on the measured loudness of the audio stream before and after the transition, wherein the pre-transition and post-transition portions correspond to less that the entire audio stream.

11. The system of claim 10, where the transition corresponds to the audio stream transitioning between at least one of:

a program boundary and an interstitial material boundary, an interstitial material boundary and a program boundary, a first program boundary and a second program boundary, and a first interstitial material boundary and a second interstitial material boundary.

12. The system of claim 10, where the loudness measuring logic is configured to measure a short-term and a long-term loudness of the audio stream before and after the transition.

13. The system of claim 10, further comprising:

a data store configured to store the loudness of the audio stream measured before the transition upon indication of the transition.

14. The system of claim 10, further comprising:

a decoder configured to decode the encoded signal to obtain the audio stream.

15. The system of claim 10, where the gain adjustment logic includes:

a gain adjustment calculator configured to calculate a gain value based at least in part on the measured loudness of the audio stream before the transition and the measured loudness of the audio stream after the transition, and the delay time of the delayed encoded signal;

a gain word formatter configured to produce a gain control metadata parameter based on the gain value; and a multiplexer configured to insert the gain control metadata parameter in the delayed encoded signal.

16. A method of improving loudness consistency, the method comprising:

receiving an encoded audio stream;

introducing a time delay in the encoded audio stream to produce a delayed encoded audio stream;

decoding the audio stream;

measuring weighted loudness of the decoded audio stream before a transition, where the transition corresponds to the decoded audio stream transitioning between at least one of:

a program boundary and an interstitial material boundary, an interstitial material boundary and a program boundary, a first program boundary and a second program boundary, and a first interstitial material boundary and a second interstitial material boundary;

receiving a transition indication;

measuring weighted loudness of the decoded audio stream after the transition;

calculating and formatting a gain control metadata parameter calculated to control gain of pre-transition and post-transition portions of the audio stream that are less than the entire audio stream based at least in part on the measured weighted loudness of the decoded audio stream before the transition and the measured weighted loudness of the decoded audio stream after the transition; and inserting the gain control metadata parameter in the delayed encoded audio stream.

17. The method of claim 16, where the measuring weighted loudness of the decoded audio stream before the transition and the measuring weighted loudness of the decoded audio stream after the transition includes measuring short-term and long-term weighted loudness of the decoded audio stream.

18. The method of claim 16, where the measuring weighted loudness of the decoded audio stream before the transition and the measuring weighted loudness of the decoded audio stream after the transition includes employing at least one of Leq(A), ITU-R BS.1770, and CBS Loudness.

19. The method of claim 16, where the transition indication is selected from the group consisting of: an externally supplied trigger, a contact closure, a serial control, Ethernet control, metadata control via serial communication, metadata extracted from vertical ancillary data space, a level detect of the decoded audio stream, and a level detect of video associated with the encoded audio stream.

20. The method of claim 16, where the time delay is at least one of:

an adjustable time delay, and part of a profanity or content protection delay.

21. The method of claim 16, further comprising:

resetting the measured weighted loudness of the decoded audio stream before the transition prior to measuring the weighted loudness of the decoded audio stream after the transition.

22. The system of claim 10, wherein the loudness measuring logic is configured to reset the measured loudness of the audio stream before the transition prior to measuring loudness of the audio stream after the transition.

* * * * *